US012604558B2

(12) United States Patent
Huang et al.

(10) Patent No.: US 12,604,558 B2
(45) Date of Patent: Apr. 14, 2026

(54) LIGHT DETECTING DEVICE HAVING A GRADIENT LAYER WITH MULTIPLE SUBLAYERS

(71) Applicant: LandMark Optoelectronics Corporation, Tainan City (TW)

(72) Inventors: Hung-Wen Huang, Tainan City (TW); Yung-Chao Chen, Tainan City (TW); Yi-Hsiang Wang, Tainan City (TW); Wei Lin, Tainan City (TW)

(73) Assignee: LANDMARK OPTOELECTRONICS CORPORATION, Tainan City (TW)

( * ) Notice: Subject to any disclaimer, the term of this patent is extended or adjusted under 35 U.S.C. 154(b) by 452 days.

(21) Appl. No.: 18/192,430

(22) Filed: Mar. 29, 2023

(65) Prior Publication Data

US 2024/0162356 A1     May 16, 2024

(30) Foreign Application Priority Data

Nov. 11, 2022     (TW) .................................. 111143159

(51) Int. Cl.
| | |
|---|---|
| *H10F 77/169* | (2025.01) |
| *H10F 77/124* | (2025.01) |
| *H10F 77/14* | (2025.01) |

(52) U.S. Cl.
CPC ....... *H10F 77/169* (2025.01); *H10F 77/1248* (2025.01); *H10F 77/146* (2025.01)

(58) Field of Classification Search
CPC ..... H10F 77/124; H10F 77/169; H10F 77/146
See application file for complete search history.

(56) References Cited

U.S. PATENT DOCUMENTS

| | | | | |
|---|---|---|---|---|
| 2018/0166857 A1* | 6/2018 | Chiu | ........................ | H01S 5/162 |
| 2020/0098634 A1* | 3/2020 | Tsunami | ............. | H01L 21/3085 |
| 2021/0135428 A1* | 5/2021 | Hamaguchi | ......... | H01S 5/18341 |

FOREIGN PATENT DOCUMENTS

| | | | | |
|---|---|---|---|---|
| CN | 103325863 A | 9/2013 | | |
| CN | 105609585 A | * 5/2016 | ......... | H10F 71/1272 |
| CN | 115513276 A | * 12/2022 | ........... | H10D 62/124 |

(Continued)

OTHER PUBLICATIONS

Search Report appended to an Office Action, which was issued to Taiwanese counterpart application No. 111143159 by the TIPO on Dec. 8, 2023, with an English translation thereof.

*Primary Examiner* — William B Partridge
*Assistant Examiner* — Felix B Andrews
(74) *Attorney, Agent, or Firm* — MUNCY, GEISSLER, OLDS & LOWE, P.C.

(57) ABSTRACT

A light detecting device includes a substrate that has a lattice constant. A buffer layer is disposed on the substrate. A gradient layer is formed on the buffer layer opposite to the substrate, and includes a plurality of sublayers that have respectively lattice constants each of which is greater than the lattice constant of the substrate. The sublayers are arranged in a manner that the lattice constants of the sublayers undergo a gradual increase in lattice constant in a direction away from the substrate. A barrier layer is formed on the gradient layer opposite to the buffer layer, and has a lattice constant which is greater than that of the substrate and no smaller than the lattice constants of the sublayers. An absorption layer is formed on the barrier layer opposite to the gradient layer.

13 Claims, 6 Drawing Sheets

(56)        References Cited

FOREIGN PATENT DOCUMENTS

JP        H1012914  A  *  1/1998
JP        2008235519  A  *  10/2008
TW        200603267  A    1/2006

* cited by examiner

1

15

14

13

12

11

| Growth Angle | | |
|---|---|---|
| $\theta < 1°$ | $1° \leqq \theta < 6°$ | $6° \leqq \theta \leqq 14°$ |
| | | |
| Comparative Example 1 | Comparative Example 2 | First Embodiment |

FIG.5

LIGHT DETECTING DEVICE HAVING A GRADIENT LAYER WITH MULTIPLE SUBLAYERS

CROSS-REFERENCE TO RELATED APPLICATION

This application claims priority to Taiwanese Invention Patent Application No. 111143159, filed on Nov. 11, 2022.

FIELD

The disclosure relates to a semiconductor detecting device, and more particularly to a semiconductor light detecting device.

BACKGROUND

Referring to FIG. 1, a conventional light detecting device 1 formed by molecular beam epitaxy includes a substrate 11, a buffer layer 12 that is formed on the substrate 11, a quantum well layer 13 that is formed on the buffer layer 12 opposite to the substrate 11 and that blocks light so as to generate electric signals, an absorption layer 14 that is formed on the quantum well layer 13 opposite to the buffer layer 12 and that absorbs light, and a window layer 15 that is formed on the absorption layer 14 opposite to the quantum well layer 13 and that limits range of an opening from which the light enters. During operation of the light detecting device 1, the light enters from the opening and shines on the absorption layer 14, which absorbs energy from the light and transmits the light energy to the quantum well layer 13. According to the bandgap formed by various compositions of materials in the quantum well layer 13, when the quantum well layer 13 absorbs the light and generates an energy shift, the electric signals that correspond to the light absorbed by the absorption layer 14 are generated. The electric signals generated may be converted according to a specific formula to achieve the purpose of light detecting.

The buffer layer 12 formed between the substrate 11 and the quantum well layer 13 is made of a material substantially the same as that of the substrate 11. Specifically, when the substrate 11 is made of n+ doped gallium arsenide (GaAs), the buffer layer 12 may be made of n-type doped gallium arsenide. When the compositions of the quantum well layer 13 are quite different from those of the substrate 11, the buffer layer 12 serves as a buffer between the substrate 11 and the quantum well layer 13 during epitaxy growth.

However, due to difference between lattice constants of the layers in the light detecting device 1 being too great, despite having the buffer layer 12 disposed between the substrate 11 and the quantum well layer 13, lattice mismatch still occurs often and thereby stress in the layers is accumulated continually during epitaxy. When the stress accumulated is too great, defects of various magnitude may start to appear in each of the layers. Such defects may produce dark current that may affect performance of the light detecting device 1. If the dark current exceeds a certain standard value, accuracy of the light detecting device 1 may be affected or the light detecting device 1 may become unusable at all.

SUMMARY

Therefore, an object of the disclosure is to provide a light detecting device that can alleviate at least one of the drawbacks of the prior art.

According to the disclosure, the light detecting device includes a substrate, a buffer layer, a gradient layer, a barrier layer, and an absorption layer. The substrate has a lattice constant that is a reference value. The buffer layer is disposed on the substrate. The gradient layer is formed on the buffer layer opposite to the substrate, and includes a plurality of sublayers that have respectively a plurality of lattice constants each of which is greater than the reference value of the substrate. The sublayers are arranged in such a manner that the lattice constants of the sublayers undergo a gradual increase in lattice constant in a direction away from the substrate. The barrier layer is formed on the gradient layer opposite to the buffer layer, and has a predetermined lattice constant which is greater than the reference value of the substrate and no smaller than the lattice constants of the sublayers. The absorption layer is formed on the barrier layer opposite to the gradient layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 5 is a microscope image diagram illustrating quality of the growth angle of an example of the first embodiment in comparison with quality of a growth angle of each of a first comparative example and a second comparative example.

DETAILED DESCRIPTION

Figure 1:
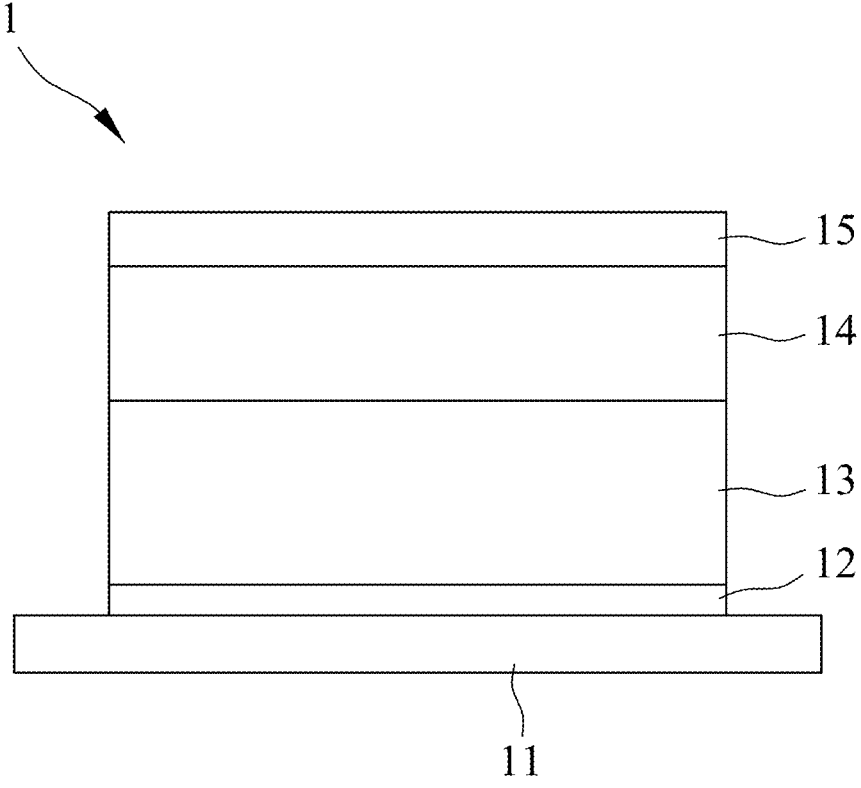
FIG. 1 is a side view illustrating a light detecting device according to prior art.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
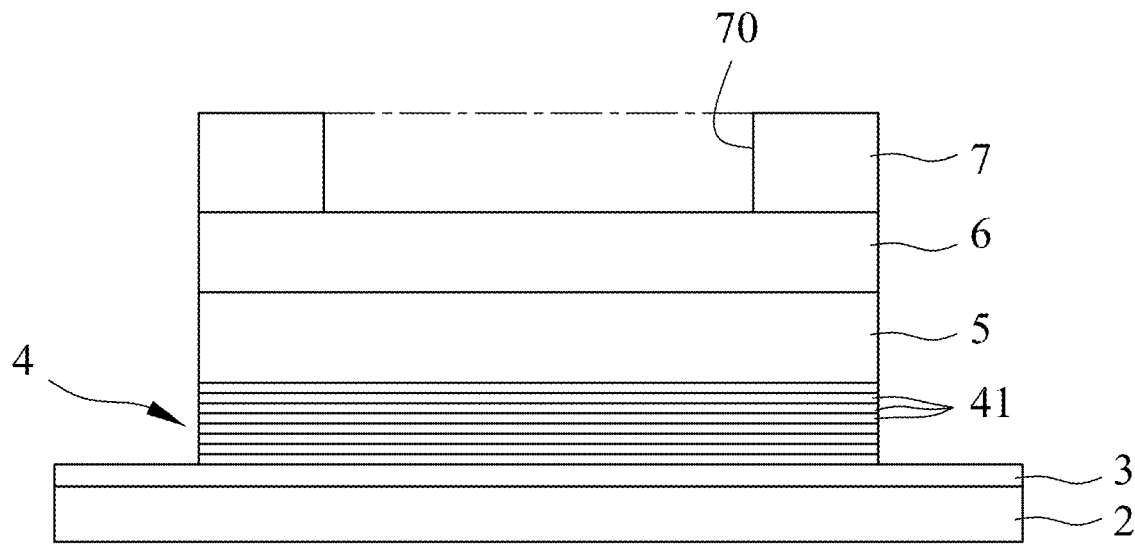
FIG. 2 is a side view illustrating a first embodiment and a second embodiment of a light detecting device according to the present disclosure.

Referring to FIG. 2, a first embodiment of a light detecting device is provided. The light detecting device includes a substrate 2 having a lattice constant that is a reference value, a buffer layer 3 disposed on the substrate 2, a gradient layer 4 formed on the buffer layer 3 opposite to the substrate 2, a barrier layer 5 formed on the gradient layer 4 opposite to the buffer layer 3 and having a lattice constant that is a predetermined value greater than the reference value of the substrate 2, an absorption layer 6 formed on the barrier layer 5 opposite to the gradient layer 4, and a window layer 7 formed on the absorption layer 6 opposite to the barrier layer 5 and has at least one light entering opening 70. In some embodiments, the window layer 7 is made of indium gallium phosphide, and the absorption layer 6 is made of indium gallium arsenide. According to the first embodiment, each of the layers of the light detecting device is formed by molecular beam epitaxy.

The substrate 2 is made of gallium arsenide. To match with the substrate 2, the buffer layer 3 is also made of gallium arsenide, except that the buffer layer 3 has a thickness that is smaller than that of the substrate 2 and may be doped with different compositions. In this embodiment, the substrate 2 and the buffer layer 3 are both made of n-type doped gallium arsenide. The lattice constant of the substrate 2 is the reference value. When the substrate 2 is made of n-type doped gallium arsenide, the reference value is 5.653.

The gradient layer 4 includes a plurality of sublayers 41 that have respectively a plurality of lattice constants each of which is greater than the reference value of the substrate 2. The sublayers 41 are arranged in such a manner that the lattice constants of the sublayers 41 undergo a gradual increase in lattice constant in a direction away from the substrate 2. The predetermined value of the lattice constant of the barrier layer 5 is no smaller than the lattice constants of the sublayers 41. Specifically, the gradient layer 4 and barrier layer 5 are both made of indium gallium arsenide, and the predetermined value of the lattice constant of the barrier layer 5 is 5.750.

The substrate 2 has a first element, and the barrier layer 5 has the first element and a second element different from the first element. Each of the sublayers 41 of the gradient layer 4 has the first element and the second element. In this embodiment, the first element is gallium, and the second element is indium. One of the sublayers 41 of the gradient layer 4 is in direct contact with the barrier layer 5. A ratio of the first element to the second element in the sublayers 41 gradually decreases in a direction from the substrate 2 to the barrier layer 5. The ratio of the first element to the second element of the one of the sublayers 41 is identical to a ratio of the first element to the second element of the barrier layer 5. The ratio of the first element to the second element of each of the sublayers 41 of the gradient layer 4 is defined to be $(1-X):X$, wherein X ranges from 0.03 to 0.24.

TABLE 1

| | Material | Thickness(nm) | Lattice Constant |
|---|---|---|---|
| Substrate2 | N—GaAs | 625 ± 25 | 5.653 |
| Buffer Layer 3 | N—GaAs | 100 | 5.653 |
| Gradient Layer 4 Sublayer 41 | N—$In_{0.03}Ga_{0.97}As$ | 200 | 5.665 |
| Sublayer 41 | N—$In_{0.06}Ga_{0.94}As$ | 200 | 5.667 |
| Sublayer 41 | N—$In_{0.09}Ga_{0.91}As$ | 200 | 5.690 |
| Sublayer 41 | N—$In_{0.12}Ga_{0.88}As$ | 200 | 5.702 |
| Sublayer 41 | N—$In_{0.15}Ga_{0.85}As$ | 200 | 5.714 |
| Sublayer 41 | N—$In_{0.18}Ga_{0.82}As$ | 200 | 5.726 |
| Sublayer 41 | N—$In_{0.21}Ga_{0.79}As$ | 200 | 5.738 |
| Sublayer 41 | N—$In_{0.24}Ga_{0.76}As$ | 200 | 5.750 |

4

TABLE 1-continued

| | Material | Thickness(nm) | Lattice Constant |
|---|---|---|---|
| Barrier Layer 5 | N—$In_{0.24}Ga_{0.76}As$ | 2000 | 5.750 |
| Absorption Layer 6 | N—$In_{0.24}Ga_{0.76}As$ | 2000 | 5.750 |
| Window Layer 7 | N—$In_{0.72}Ga_{0.28}P$ | 500 | 5.752 |

Figure 3:
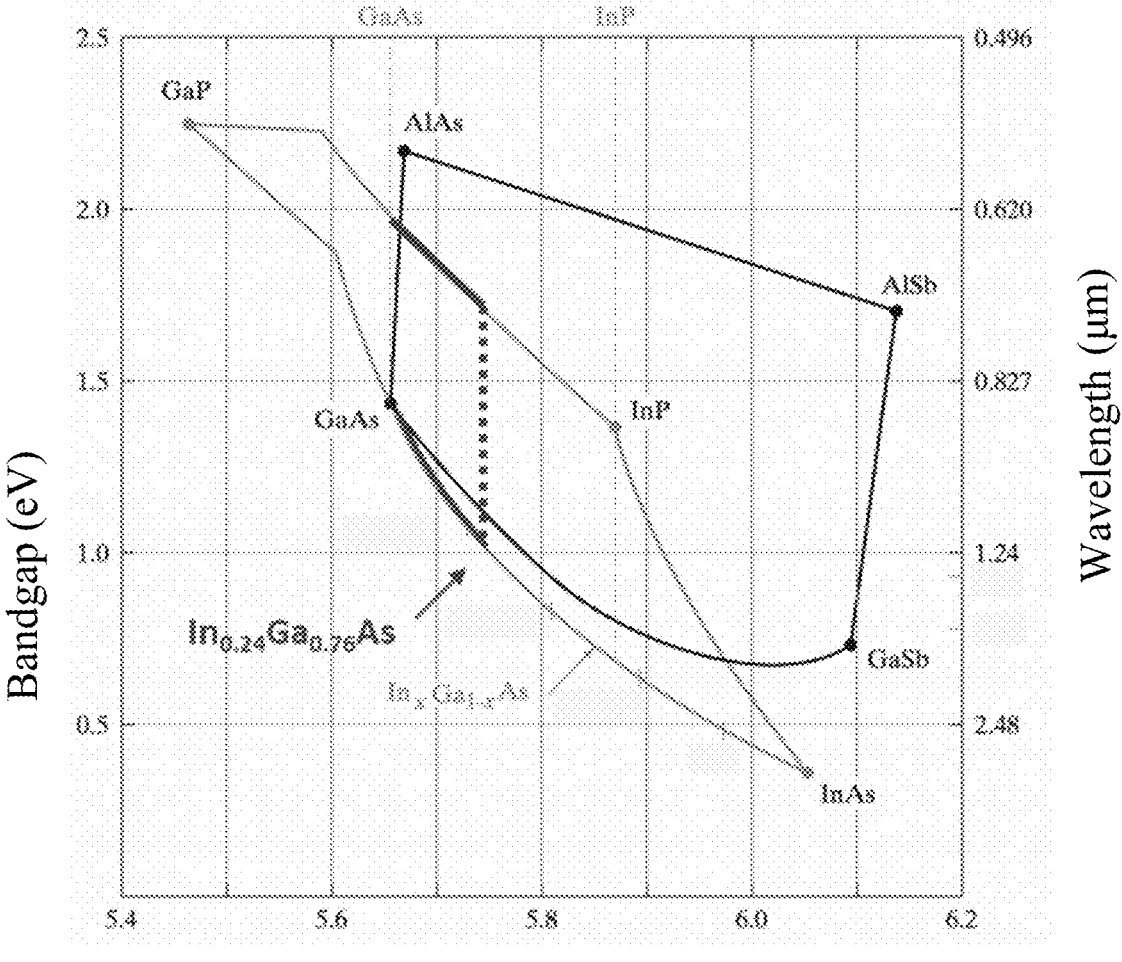
FIG. 3 is a graphical diagram illustrating a relationship among lattice constant, bandgap, and wavelength for sublayers of a gradient layer according to the first embodiment.

Referring to Table 1 and FIGS. 2 and 3, the sublayers 41 of the gradient layer 4 serve to alleviate problems due to difference between the buffer layer 3 and the barrier layer 5 in terms of lattice constant. In Table 1, the gradient layer 4 is provided with eight sublayers 41, each of which has a sum of indium proportion and gallium proportion being equal to 1. The indium proportions in the sublayers 41 are 0.3, 0.6, 0.9, 0.12, 0.15, 0.18, 0.21, and 0.24, respectively, and the gallium proportions in the sublayers 41 are 0.97, 0.94, 0.91, 0.88, 0.85, 0.82, 0.79, and 0.76, respectively. By gradually increasing the indium proportion and by gradually decreasing the gallium proportion, a gradual change in lattice constant from the reference value of the substrate 2 to the predetermined lattice constant of the barrier layer 5 may be realized. Thus, problems due to the difference between the reference and predetermined values of the buffer layer 3 and the barrier layer 5 in terms of lattice constant may be alleviated or eliminated.

Figure 4:
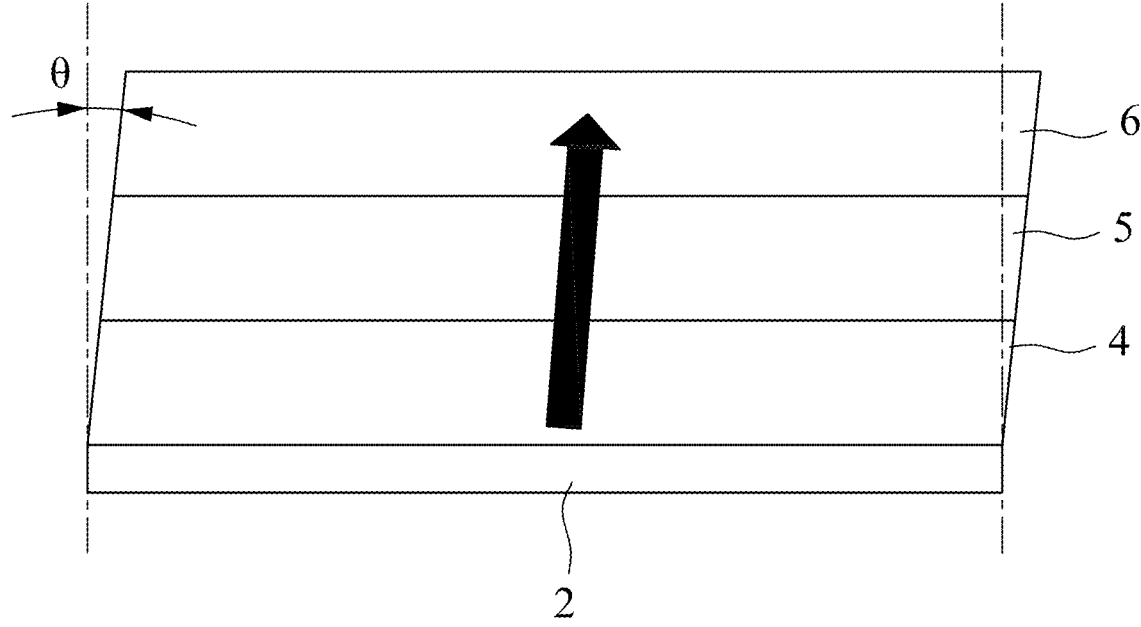
FIG. 4 is a schematic view illustrating a growth angle of layers formed according to the first embodiment.

Referring to FIGS. 2, 4 and 5, the gradient layer 4, the barrier layer 5 and the absorption layer 6 are epitaxially grown in a direction that forms a growth angle (θ) with a reference line, i.e., a line normal to the substrate 2. The growth angle (θ) ranges from 6 degrees to 14 degrees. FIG. demonstrates a comparison among an example of the first embodiment having the growth angle ranging from 6 degrees to 14 degrees, a first comparative example having the growth angle smaller than 1 degree, and a second comparative example having the growth angle greater than or equal to 1 degree and smaller than 6 degrees. According to the microscope image in FIG. 5, the example of the first embodiment exhibits better flatness. It can be seen that the growth angle (θ) can affect the quality of manufacturing of the light detecting device and may reduce formation of defects.

Figure 6:
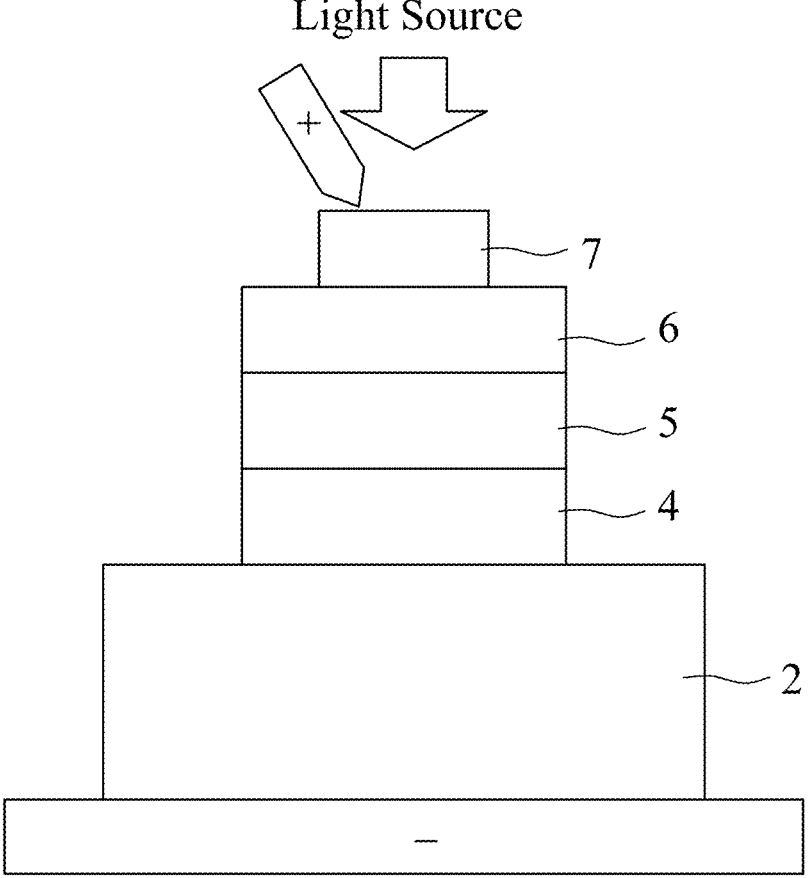
FIG. 6 is a schematic view illustrating the first embodiment of the light detecting device undergoing a dark current test.

Referring to FIGS. 2 and 6, in this embodiment, the light detecting device has a specification of 1130 nm. In addition to using microscope image to detect if the defects of the first embodiment are acceptable according to industry standard, to effectively ensure that the first embodiment may reduce dark current, a reverse bias was applied to the first embodiment and light was introduced from the light entering opening 70 for testing.

TABLE 2

| Window Layer 7 diameter (μm) | 107 | 125 | 145 | 195 |
|---|---|---|---|---|
| Dark Current (A/$cm^2$) | 1.4E−7 | 2.6E−8 | 1.1E−8 | 9.7E−8 |

Dark current testing standard: <1.0E−7

Referring to Table 2, test results were obtained under the conditions that each of the light entering openings 70 is a circle, and diameters of the light entering openings 70 of the window layer 7 are 107 μm, 125 μm, 145 μm, and 195 μm. At a reverse bias of 0.1 V, the light entering openings 70 having the diameters of 125 μm, 145 μm, and 195 μm all passed the test except for the one with the diameter of 107 μm, which exceeded the testing standard slightly. Therefore, one can conclude that the first embodiment performed well in the dark current test and its finished product may meet a certain range of specifications.

Referring to FIG. 2 again, a second embodiment of the present disclosure is provided and is substantially the same as the first embodiment except that the barrier layer 5 and the gradient layer 4 are both made of indium gallium phosphide (InGaP). Specifically, the proportions of elements of the barrier layer 5 in practice of the second embodiment are represented by $N\text{—}In_{0.72}Ga_{0.28}P$. In this embodiment, the first element is gallium (Ga) and the second element is indium (In). In order to design a gradual change in lattice constant in the gradient layer 4, the ratio of the first element to the second element of each of the sublayers 41 is defined to be (1–X):X, with X ranging from 0.48 to 0.72. The substrate 2 and the buffer layer 3 are made of the same materials as those of the first embodiment (i.e., the lattice constant of the buffer layer 3 is identical to the reference value of the substrate 2). When the predetermined lattice constant of the barrier layer 5 of this embodiment is greater than that of the first embodiment, the sublayers 41 of the gradient layer 4 may be more than eight so as to achieve the gradual change from the substrate 2 to the barrier layer 5 in terms of lattice constant, to reduce the defects, and to reduce dark current as with in the first embodiment.

In summary, by designing a gradually change in lattice constant for the sublayers 41 of the gradient layer 4 in the direction from the substrate 2 to the barrier layer 5, the light detecting device of the disclosure may avoid accumulating stress during epitaxy growth, thereby preventing defects due to the stress. In addition to ensuring product quality, when subjecting the light detecting device to the dark current test, results show that the present disclosure is less likely to produce dark current, and therefore its detecting performance is better as compared to prior art. Thus, the purpose of the present disclosure is achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light detecting device, comprising:
a substrate having a lattice constant that is a reference value;
a buffer layer disposed on said substrate;
a gradient layer formed on said buffer layer opposite to said substrate, and including a plurality of sublayers that have respectively a plurality of lattice constants each of which is greater than said reference value of said lattice constant of said substrate, said sublayers being arranged in such a manner that said lattice constants of said sublayers undergo a gradual increase in lattice constant in a direction away from said substrate;
a barrier layer formed on said gradient layer opposite to said buffer layer and having a predetermined lattice constant which is greater than said reference value of said substrate and no smaller than said lattice constants of said sublayers; and
an absorption layer formed on said barrier layer opposite to said gradient layer,
wherein said gradient layer, said barrier layer and said absorption layer are epitaxially grown in a direction that forms a growth angle with a line normal to said substrate, said growth angle ranging from 6 degrees to 14 degrees.

2. The light detecting device as claimed in claim 1, wherein said substrate has a first element, and said barrier layer has said first element and a second element different from said first element, each of said sublayers of said gradient layer having said first element and said second element, a ratio of said first element to said second element in said sublayers gradually decreasing in a direction from said substrate to said barrier layer.

3. The light detecting device as claimed in claim 2, wherein said first element is gallium, and said second element is indium.

4. The light detecting device as claimed in claim 3, wherein said substrate is made of gallium arsenide, and said barrier layer is made of indium gallium arsenide.

5. The light detecting device as claimed in claim 3, wherein said gradient layer is made of indium gallium arsenide.

6. The light detecting device as claimed in claim 3, wherein the ratio of said first element to said second element of each of said sublayers of said gradient layer is defined to be (1–X):X, X ranging from 0.03 to 0.24.

7. The light detecting device as claimed in claim 3, wherein said substrate is made of gallium arsenide, and said barrier layer is made of indium gallium phosphide.

8. The light detecting device as claim in claim 7, wherein said gradient layer is made of indium gallium phosphide.

9. The light detecting device as claimed in claim 7, wherein the ratio of said first element to said second element of each of said sublayers of said gradient layer is defined to be (1–X):X, X ranging from 0.48 to 0.72.

10. The light detecting device as claimed in claim 2, wherein one of said sublayers of said gradient layer is in direct contact with said barrier layer, the ratio of said first element to said second element of said one of said sublayers being identical to a ratio of said first element to said second element of said barrier layer.

11. The light detecting device as claimed in claim 2, wherein said absorption layer is made of indium gallium arsenide.

12. The light detecting device as claimed in claim 1 further comprising a window layer formed on said absorption layer opposite to said barrier layer and having at least one light entering opening.

13. The light detecting device as claimed in claim 12, wherein said window layer is made of indium gallium phosphide.

\* \* \* \* \*